United States Patent [19]
Meyers

[11] 4,369,687
[45] Jan. 25, 1983

[54] PITCH SENSOR

[76] Inventor: Stanley T. Meyers, 122 N. Riverside Ave., Red Bank, N.J. 07701

[21] Appl. No.: 158,474

[22] Filed: Jun. 11, 1980

[51] Int. Cl.³ .................. G01R 23/14; G10G 7/02
[52] U.S. Cl. .................. 84/454; 84/DIG. 18; 324/79 D
[58] Field of Search .................. 84/1.01, 1.15, 454, 84/455, 456, 457, 458, 459, 460, DIG. 18; 324/77 B, 77 C, 77 CS, 79 R, 79 D

[56] References Cited

U.S. PATENT DOCUMENTS

| | | | |
|---|---|---|---|
| 2,584,277 | 2/1952 | Long | 84/DIG. 18 |
| 2,806,953 | 9/1957 | Krauss | 84/454 X |
| 2,924,776 | 2/1960 | Peterson | 84/454 X |
| 2,958,250 | 11/1960 | Poehler | 84/454 |
| 3,472,116 | 10/1969 | Schott | 84/454 |
| 3,585,898 | 6/1971 | Davidson | 84/454 |
| 3,675,529 | 7/1972 | Van der Woerd | 84/455 |
| 3,688,010 | 8/1972 | Freeman | 84/DIG. 18 |
| 3,722,352 | 3/1973 | Ihrke et al. | 84/454 |
| 3,879,684 | 4/1975 | Sanderson | 84/DIG. 18 |
| 3,952,625 | 4/1976 | Peterson | 84/454 |
| 3,968,719 | 7/1976 | Sanderson | 84/454 |
| 3,991,645 | 11/1976 | Luce et al. | 84/454 X |
| 4,019,419 | 4/1977 | Yoshikawa et al. | 84/454 |
| 4,023,462 | 5/1977 | Denov et al. | 84/454 |
| 4,028,985 | 6/1977 | Merritt | 84/454 |
| 4,058,044 | 11/1977 | Murakami | 84/454 X |
| 4,077,298 | 3/1978 | Kondo | 84/454 |
| 4,122,751 | 10/1978 | Calvin | 84/454 |
| 4,142,434 | 3/1979 | Gross | 84/454 X |

Primary Examiner—Stanley J. Witkowski
Attorney, Agent, or Firm—R. Martin Oliveras

[57] ABSTRACT

A pitch sensor for facilitating more accurate tuning of instruments comprises: a reference pitch pulse generator, a saw-tooth generator, a sensing probe, a probe output amplifier, a modulator, and ouput means. The reference pitch pulse generator further comprises an oscillator, a divider chain, gates, and first and second pulse drivers. According to a specific embodiment of the present invention, the sensing probe is a magnetic probe, the oscillator is a crystal oscillator, the divider chain is a decimal divider chain, and the output means is a speaker. Accordingly, the saw-tooth generator is responsive to the reference pitch pulse generator; the probe output amplifier is responsive to the magnetic probe; the modulator is jointly responsive to the saw-tooth generator and to the probe output amplifier; and the speaker is responsive to the modulator. A feature of the present invention is the use of the saw-tooth generator to drive the modulator.

17 Claims, 5 Drawing Figures

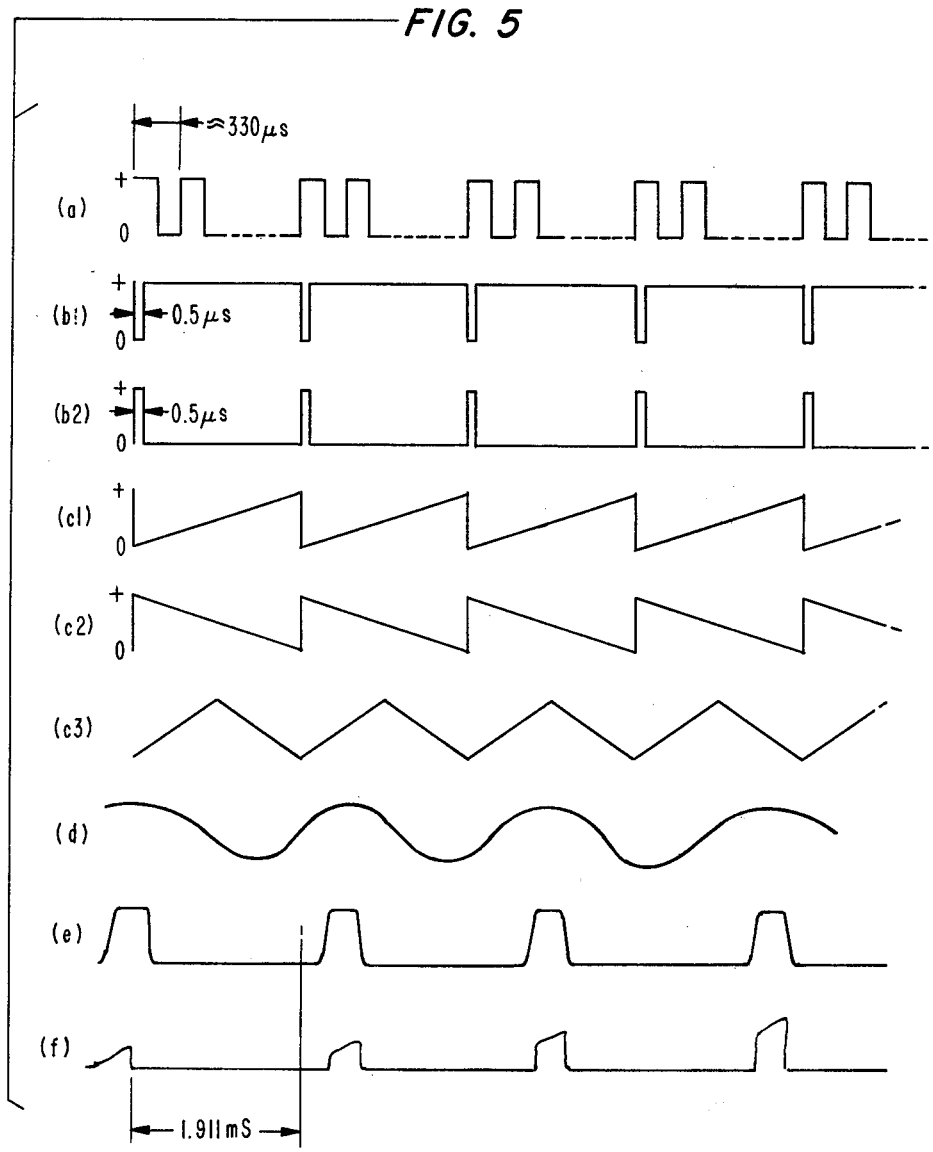

PITCH SENSOR

BACKGROUND OF THE INVENTION

Prior art pitch sensors have included stroboscopes and oscilloscopes to effect the pitch sensing/instrument tuning functions. Also, as is well known, tuning forks have also been used to effect the instrument tuning function.

For example, Long U.S. Pat. No. 2,584,277 entitled "Electronic Tuning Device" discloses a device for producing two precise frequences such as A at 440 $H_z$ and B flat for use primarily as a reference for orchestra tuning. The output of such device is either audio or a strobe disc;

Krauss U.S. Pat. No. 2,806,953 entitled "Electronic Oscillator for Producing Frequencies of Musical Tones" discloses a device wherein reference frequency tones covering one octave of the equally tempered musical scale are generated for comparison with tones picked up from the musical instrument. In such device, comparison is made using a synchronously driven strobe disc;

Peterson U.S. Pat. No. 2,924,776 entitled "Tuner" discloses a device wherein reference frequency tones covering one octave of the equally tempered musical scale are generated for the highest octave. Tandam 2:1 dividers are provided to cover the lower octaves. These tones are compared with corresponding tones picked up from the musical instrument with or without added diode distortion and made audible by beats from a loud speaker;

Poehler U.S. Pat. No. 2,958,250 entitled "Musical Instrument Tuning Apparatus" discloses a device wherein reference frequency tones covering one octave are arranged to give a circular pattern to an oscilloscope. Tones from a musical instrument are made to generate light and dark segments in the circular pattern which are stationary or rotate in one direction or the other depending on relative tone conditions;

Schott U.S. Pat. No. 3,472,116 entitled "Device for Producing Frequency Intervals For Tuning Musicals Instruments" discloses a device wherein a voltage controlled oscillator is made to lock in to a first musical instrument pitch tone picked up by a sound sensing means associated with that tone. A reference signal is then generated and relatively shifted in pitch by the 12th root of two for use in adjusting an adjacent pitch tone picked up by a second sensing means. Scalewise tuning is accomplished by successively shifting the double sensing means from each adjusted tone to the next;

Davidson U.S. Pat. No. 3,585,898 entitled "Musical Instrument Tuning Reference Standard" discloses a device wherein the standard is derived using the 60 $H_z$ power frequency divided by two, squaring the wave shape, and selecting out the 11th harmonic to obtain 330 $H_z$, being almost the tempered reference pitch tone E for use in guitars and similiar instruments;

Freeman U.S. Pat. No. 3,688,010 entitled "Tone Modulation System" discloses a device relating to the generation of musical tones with no relation to musical instrument tuning;

Ihrke U.S. Pat. No. 3,722,353 entitled "Pitch Measurement Circuit" discloses a device whose primary use is to compare the playing of single tone musical instruments such as voice, violin, woodwinds, etc. recorded on one track of a two track tape recorder with an identical sequence of correctly played tones on the second track. A system of lights indicates whether the tones under test are above, below, or on pitch;

Sanderson U.S. Pat. No. 3,879,684 entitled "Tuneable UJT Oscillator Circuit" discloses a device using phase comparison of reference and test tones to indicate the relative pitch conditions. These are indicated in an array of lights which are sequentially lighted for off-pitch conditions and stationary lighting for the on-pitch state;

Peterson U.S. Pat. No. 3,952,625 entitled "Electronic Tuning Device" discloses a device for generating reference tones of the musical scale by downward counting from an adjustable high frequency oscillator frequency. A motor synchronously driven by these tones rotates a strobe disc for comparison with tones picked up from a musical instrument. Provision is also made for audible comparison;

Sanderson U.S. Pat. No. 3,968,719 entitled "Method for Tuning Musical Instruments" discloses a device similar to that of U.S. Pat. No. 3,879,684 but with an added tuning arrangement by which "stretch" may be taken into account;

Luce U.S. Pat. No. 3,991,645 entitled "Electronic Musical Instrument with Exponential Keyboard and Voltage Controlled Oscillator" discloses a device wherein a key selects a control voltage from an exponential voltage divider for controlling the frequency of a voltage controlled oscillator which produces a frequency which is directly proportional to the control voltage and inversely proportional to a reference voltage;

Yoshikawa U.S. Pat. No. 4,019,419 entitled "Tuning Device" discloses a device which utilizes downward counting from a high frequency oscillator to arrive at pitch tone references of the tempered scale. Provision is made for injecting into the crystal extra pulses of suitable width to provide upward or downward shifting of the reference pitch scale. Comparison is made with the musical instrument tones using a strobe disc;

Denov U.S. Pat. No. 4,023,462 entitled "Musical Instrument Tuning Device" discloses a device intended for automatic tuning of kettle drums. In such device a desired reference tone is compared to the tone from the kettle drum. The drum skin tension is automatically adjusted to match the reference tone by a motor driven servomechanism;

Merritt U.S. Pat. No. 4,028,985 entitled "Pitch Determination and Display System" discloses a device which makes use of the peaks in musical tones with measurement of time intervals between peaks as an indication of pitch;

Kondo U.S. Pat. No. 4,077,298 entitled "Apparatus for Automatically Tuning an Electronic Musical Instrument" discloses a device which provides automatic tuning of electronic musical instruments, which device employs voltage controlled oscillators as tone sources. Such device does not automatically tune standard musical instruments;

Calvin U.S. Pat. No. 4,122,751 entitled "Automatic Instrument Tuner" discloses a device which is not an automatic tuner. The automatic feature is one where the reference pitch tone closest to that coming from a musical instrument is displayed in terms of a frequency difference with lamps indicating whether this difference is above or below the reference. In such patent, mention is made of magnetic sensing but no specific device is disclosed.

It does not appear that the above cited prior art references make use of saw-tooth shaping of the type having a rapid rise or fall time followed by a slow recovery by which the instrument pitch tones are modified to give the unique sounds of the test output. It also does not appear that the above cited prior art references disclose a magnetic sensing probe for picking up or detecting vibrations such as those from piano strings.

Objects of the present invention are therefore to provide:

more accurate tuning of instruments such as a piano or other string instrument;

a pitch sensing and instrument tuning device which does not require the use of oscilloscopes, stroboscopes, or tuning forks;

an improved device to produce tones suitable for tuning musical instruments;

an improved device to generate tones suitable for tuning musical instruments and which is simple and inexpensive in construction while at the same time may be accurately calibrated;

an improved device to produce reference tones for tuning musical instruments and in which the tone pitch is not influenced by the volume or intensity of the tone produced;

an improved musical instrument tuning device having a single oscillator circuit which provides a plurality of different tones such as the 12 semitones within an octave;

an oscillator for providing a plurality of musical tones wherein the oscillator can be tuned so that the tones have precise values without affecting the frequency relationship of the different tones produced by the oscillator;

an improved musical instrument tuning device which accurately generates signals of frequencies related to the frequencies of tones to be checked and gives an audible indication of the deviation of the tones tested with respect to the correct frequencies therefor;

a tuning apparatus which permits tuning of conventional musical instruments in a musically perfect way and wherein tuning errors due to wrong control are prevented;

an improved tuning device having accuracy and stability;

an improved tuning device which can operate an audio frequency pitch standard for audible comparison with an instrument to be tuned;

a tuning device which is readily adapted for tuning a wide variety of instruments; and a musical instrument tuning device which may be easily controlled by a musician or a non-technical operator.

FIELD OF THE INVENTION

This invention relates to pitch sensor devices and musical instrument tuning devices and in particular to such devices which are applicable to pianos and other similiar instruments.

SUMMARY OF THE INVENTION

A pitch sensor for facilitating more accurate tuning of instruments comprises: a reference pitch pulse generator, a saw-tooth generator, a sensing probe, a probe output amplifier, a modulator, and output means. The reference pitch pulse generator further comprises: an oscillator, a divider chain, gates, and first and second pulse drivers. According to a specific illustrative embodiment of the present invention, the sensing probe is a magnetic probe, the oscillator is a crystal oscillator, the divider chain is a decimal divider chain, and the output means is a speaker. The saw-tooth generator is responsive to the reference pitch pulse generator; the probe output amplifier is responsive to the magnetic probe; the modulator is jointly responsive to the saw-tooth generator and to the probe output amplifier; and the speaker is responsive to the modulator. Further, the decimal divider chain is jointly responsive to the crystal oscillator and to the second pulse driver; the multiple input gates are responsive to the decimal divider chain; the first and second pulse drivers are responsive to the multiple input gates; and the saw-tooth generator is responsive to the first pulse driver.

Features of the present invention are therefore that:

a saw-tooth generator is utilized to drive the modulator;

the pitch sensor generates stable standard pitch rates covering one octave and modified for suitable comparison with instrument vibrations which are sensed and amplified;

the comparison is made in a modulator circuit to which the amplified instrument output and corresponding modified pitch rate wave are applied;

the modulator output is a modulated wave pattern made audible by a loud speaker or headphones;

the character of the resultant tone output is such that distinctive sounds readily indicate whether the instrument vibrations are above, below, or right at the corresponding reference pitch rate tone;

the reference pitch pulses are generated using a standard oscillator operating over an octave range of instrument pitch rates and issues suitable short pulse outputs;

reference pitch rate pulses are derived from a high frequency crystal oscillator with suitable division or countdown plus gating to provide the standard instrument pitch pulse rates covering at least one octave;

the saw-tooth generator is driven by the reference pitch pulses;

preferred shapes of the saw-tooth generator output provide a sudden transition followed by a ramp resulting in distinctive chirp like sounds which enable the listener to determine whether the instrument pitch is above, below, or at the associated reference pitch;

another saw-tooth generator output having equal rise and fall time causes beat tones of identical quality whether the instrument pitch is above or below the associated reference pitch;

in the modulator, the amplified magnetic probe output samples the saw-tooth generator output to yield a distinctive signal for driving the loud speaker;

the pitch output pulse for any given tone within an octave is derived at simply by dividing the oscillator frequency by the whole number which comes closest to giving the ideal pitch rate output;

an oscillator frequency is selected such that the division by whole numbers yields pitch rates of acceptable error limits;

the modulator has the property of a sampling circuit wherein instrument output pulses forward bias the 2-stage amplifier thereby causing current flow from the saw-tooth generator through the second transistor of the modulator to a transformer used to couple the loud speaker;

the probe output amplifier is capable of providing output pulses over a wide range of signal levels from the magnetic sensing probe so that long duration pitch sensing sounds are produced as an aid in the instrument tuning or adjusting process;

a 12-tone set of pitch reference standards situated in the middle range of instrument pitches, for example, around the standard A, is usable over the whole range of instrument pitches; and the chirp characteristics are everywhere discernable and render easy determination of the state of the pitch and facilitate ready correction where needed. Advantages of the present invention are therefore that:

the modulator output is a modulated wave pattern made audible by a loud speaker or earphones;

the character of the resultant tone output is such that the distinctive sounds readily indicate whether the instrument vibrations are above, below, or right at the corresponding reference pitch rate tones;

oscilloscopes, stroboscopes, and tuning forks are not necessary to effect proper pitch sensing and instrument tuning or adjustment;

the saw-tooth generator wave output pattern may be chosen in accordance with particular needs; and for the oscillator frequency selected, there results an error of a magnitude acceptable for most applications and which error is less than that for many tuning forks.

BRIEF DESCRIPTION OF THE DRAWING

The above and other objects, features, and advantages of the present invention will be better appreciated from a reading of the following detailed description and the drawing in which:

FIG. 5 is a diagram of wave-form patterns explanatory of the operation of the present invention.

DETAILED DESCRIPTION

Figure 1:
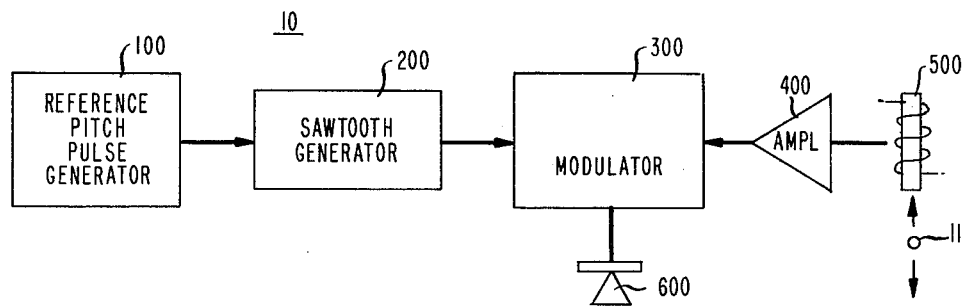
FIG. 1 is a diagram of a pitch sensor according to the present invention.

FIG. 1 is a diagram of a pitch sensor according to the present invention. FIG. 5 is a diagram of wave-form patterns explanatory of the operation of the present invention. A pitch sensor according to the present invention may be applicable to a wide range of instruments and may be advantageously applicable to instruments such as a piano and other string instruments. In addition, a sensing probe according to the present invention may advantageously be a magnetic probe or other suitable sensing probe. The output means according to the present invention may advantageously be an audible output means, such as a speaker, and may be any other suitable type of output means, such as a visual means, as dictated by the needs of the particular application. Pitch sensor 10 of FIG. 1 in this particular case specifically includes a magnetic sensing probe and a speaker output and is specifically applicable in this case to a piano. Pitch sensor 10 comprises reference pitch pulse generator 100, saw-tooth generator 200, magnetic sensing probe 500, probe output amplifier 400, modulator 300, and speaker 600. Saw-tooth generator 200 is responsive to reference pitch pulse generator 100; probe output amplifier 400 is responsive to magnetic sensing probe 500; modulator 300 is jointly responsive to saw-tooth generator 200 and to probe output amplifer 400; and speaker 600 is responsive to modulator 300. The output waveform pattern of reference pitch pulse generator 100 is shown in line 5b1 of FIG. 5, while respective waveform output patterns of saw-tooth generator 200 are shown in lines 5c1, 5c2, and 5c3 of FIG. 5. The output wave-pattern of magnetic sensing probe 500 is shown in line 5d, that of probe output amplifier 400 in line 5e, and that of modulator 300 in line 5f. Magnetic sensing probe 500 senses the motion of iron piano string 11. Line 5a of FIG. 5 shows the pulse stream output derived from oscillator 110.

Generally, pitch sensor 10 generates stable standard piano pitch rates covering one octave and modified for suitable comparison with piano vibrations magnetically sensed by magnetic sensing probe 500 and amplified by probe output amplifier 400. The analysis is made in modulator 300, to which the amplified vibrating string output and corresponding modified pitch rate wave are applied. The output of modulator 300 is a modulated wave pattern made audible by loud speaker 600 or other suitable output means. The character of the resultant tone output of loudspeaker 600 is such that distinctive sounds readily indicate whether the piano string vibrations are above, below, or right at the corresponding reference pitch rate tone. This feature is developed as a substitute for the more complicated oscilliscope or stroboscope disc means for indicating similiar conditions of the prior art.

Reference pitch pulse generator 100 provides a source of reference pitch pulses which drives saw-tooth generator 200, the output of which is applied to modulator 300. The reference pitch pulses provided by generator 100 may be generated using the standard oscillator operating over an octave range of piano pitch rates and issuing suitable short pulse outputs.

Figure 2:
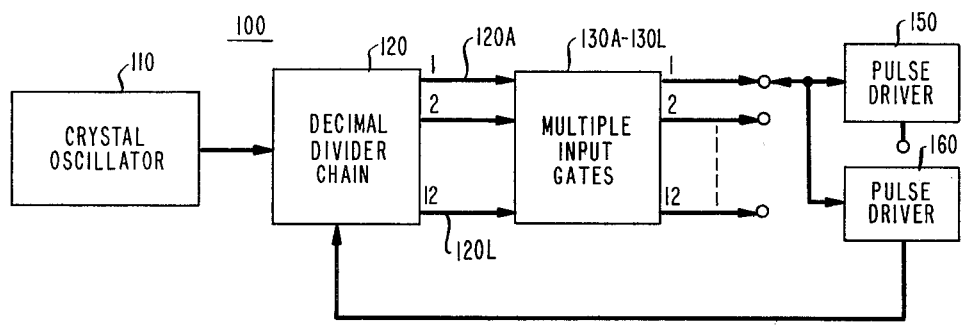
FIG. 2 is a diagram of a specific illustrative embodiment of a reference pitch pulse generator according to the present invention.

FIG. 2 is a diagram of a specific illustrative embodiment of reference pitch pulse generator 100 according to the present invention. Reference pitch pulse generator 100 comprises an oscillator such as crystal oscillator 110, a divider chain such as decimal divider chain 120, gates such as multiple gates 130A through 130L, first pulse driver 150, and second pulse driver 160. Decimal divider chain 120 is jointly responsive to crystal oscillator 110 and second pulse driver 160; the inputs of multiple input gates 130A through 130L are responsive to respective outputs 120A through 120L of decimal divider chain 120; first pulse driver 150 and second pulse driver 160 are selectively responsive to the outputs of multiple input gates 130A through 130L; second pulse driver 160 re-sets decimal divider chain 120 and first pulse driver 150 activates saw-tooth generator 200. The output wave-form pattern of crystal oscillator 110 is shown in line 5a of FIG. 5 and that of pulse drivers 150 and 160 are shown in line 5b2.

In FIG. 2, reference pitch rate pulses are derived from high frequency crystal oscillator 110, suitable division or count down plus gating providing the standard piano pitch pulse rate covering at least one octave. The use of crystal oscillator 110 has the advantage of frequency stability for deriving the required standard piano pitch rate.

Saw-tooth generator 200, which is driven by reference pitch pulse generator 100, may selectively or advantageously provide the output wave-form patterns shown in lines 5c1, 5c2, and 5c3 of FIG. 5. The waveform patterns of lines 5c1 and 5c2 are the preferred shapes since the sudden transition followed by a ramp is responsible for the distinctive chirp like sounds which enable the listener to determine whether the piano string pitch is above, below, or at the associated reference pitch. The wave-form pattern shown in line 5c3 causes beat tones of identical quality whether the piano string pitch is above or below the associated reference pitch.

The output of saw-tooth generator 200 is applied to a first input of modulator or sampling circuit 300 while the pulse-like output of amplifier 400 is applied to a second input of modulator 300. Modulator 300 samples the output of saw-tooth generator 200 to yield a distinctive signal for driving loudspeaker 600.

Figure 3:
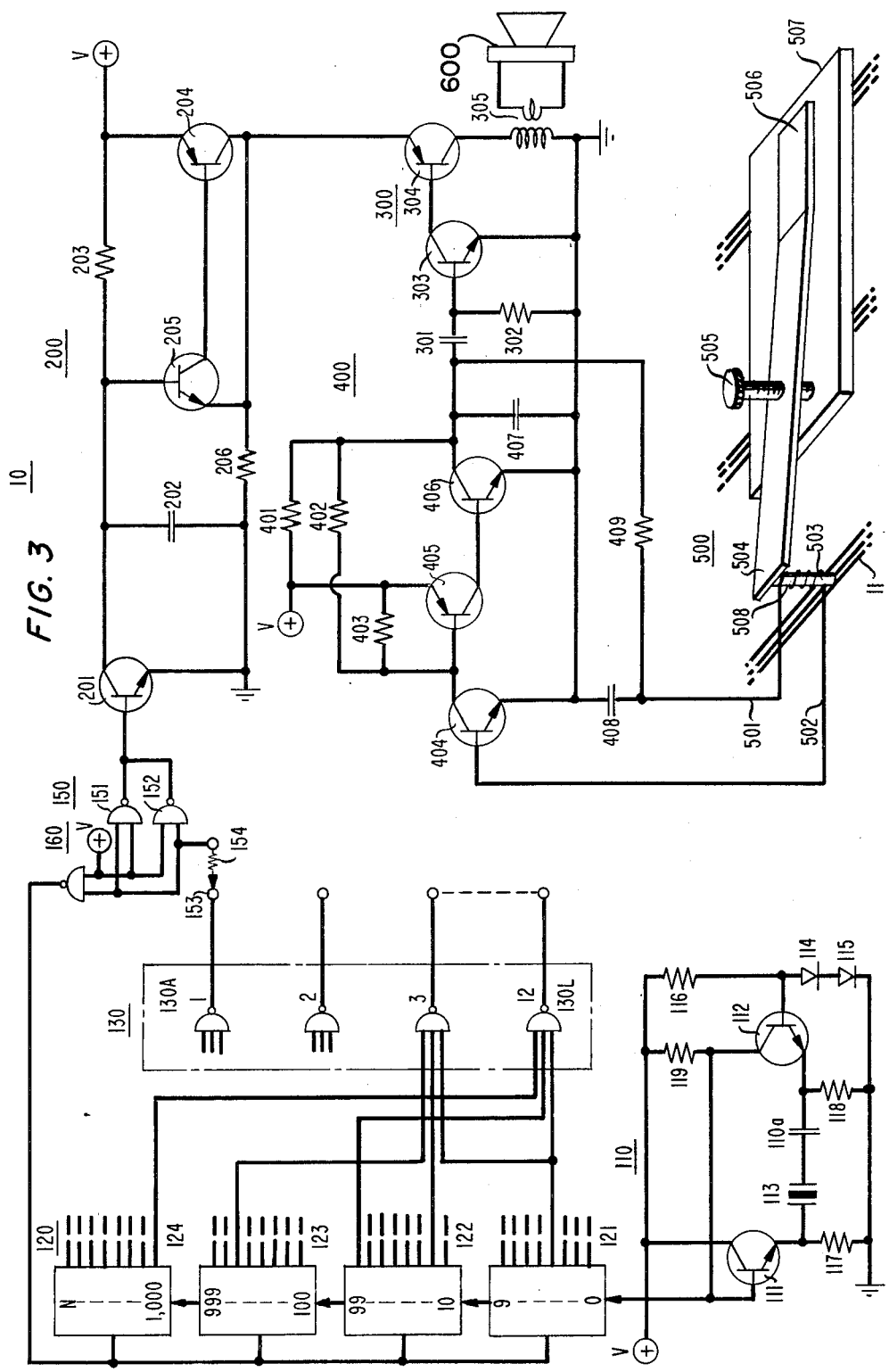
FIG. 3 is a diagram of a specific illustrative embodiment of a pitch sensor according to the present invention.

FIG. 3 is a diagram of a specific illustrative embodiment of pitch sensor 10 according to the present invention. Crystal oscillator 110 comprises transistor 111, transistor 112, crystal 113, silicon diode 114, silicon diode 115, resistor 116 having a value of 4700 ohms, resistor 117 having a value of 2200 ohms, resistor 118 having a value of 2200 ohms, resistor 119 having a value of 10,000 ohms, and capacitor 110a having a value of 20 pico farads. Voltage +V is applied to transistor 111, resistor 119, and resistor 116. Resistor 117, resistor 118, and silicon diode 115 are connected to ground G.

Crystal oscillator 110 uses transistors 111 and 112 in their broadband aspect, that is, having grounded base and emmitter follower to provide adequate circuit gain for crystal oscillator 110 at the main mode of crystal 113. In order to allow for use of a single polarity power supply +V such as a battery, transistors 111 and 112 are raised above ground G by a small positive potential of approximately 1 volt using silicon diodes 114 and 115 in tandem, and being biased by current from positive power supply +V through resistor 116. This allows for forward biasing of the emitters of transistors 111 and 112 with current established by resistors 117 and 118. This current is limited to the safe current operating limits of crystal 113. When the current through crystal 113 opposes that through either resistor 117 or 118, the respective emitter of transistor 111 or 112 goes from a low to a high impedance state thereby leaving the respective resistor directly in series with crystal 113. This limits the current in one direction. With a reversal of current through crystal 113, the respective emitter again becomes low impedance and remains that way while a similiar reversal sequence takes place in the emitter circuit of the second transistor. This gives rise to a square wave current in the transistors and therefore results in a square wave output voltage at the collector end of resistor 119. The amplitude herein is sufficient to drive the first of the decade dividers thereby setting in motion the overall divide sequence in decimal divider chain 120.

Decimal divider chain 120 comprises decade dividers 121 through 124, decade divider 121 reflecting digits 0 through 9, decade divider 122 reflecting digits 10 through 99, decade divider 123 reflecting digits 100 through 999, and decade divider 124 reflecting digits 1000 to 9999. Decade divider 121 is jointly responsive to the output wave-form pattern of crystal oscillator 110 and to the output of second pulse driver 160; Decade divider 122 is jointly responsive to decade divider 121 and to second pulse driver 160; decade divider 123 is jointly responsive to decade divider 122 and to second pulse driver 160; and decade divider 124 is jointly responsive to decade divider 123 and to second pulse driver 160. The outputs of decade dividers 121, 122, 123 and 124 are applied to selective nand gates of multiple input gates 130A through 130L. The output of second pulse driver 160 serves as a reset function to decade dividers 121 through 124. Such reset input to decimal divider chain 120 from second pulse driver 160 is shown as wave-form pattern line 5b2 of FIG. 5.

Multiple input gates 130 comprises nand gates 130A through 130L which are responsive to decimal divider chain 120. The output of multiple input gates 130 are selectively supplied to first pulse driver 150 and second pulse driver 160. In this illustrative embodiment there is reflected the production of a wave-form frequency output from multiple input gates 130 at 523.08 $H_z$. This particular output frequency of multiple input gates 130 is derived as follows:

A whole number division of the crystal oscillator output frequency provides the desired pitch pulse reference. In this example, the crystal oscillator output frequency is 326.4 $KH_z$ and must be divided by the whole number 624 to yield the 523.08 $H_z$ pitch pulse rate. The division of 624 in divider chain 120 is obtained by connecting the 3 inputs of 130C gate, in order, to the 6th step of decade counter 123, to the second step of decade counter 122, and to the 4th step of decade counter 121. When the 624 count has been reached, all three inputs to the gate are energized causing a pulse to appear at the output. The pulse thus attained is then made to reset the divider chain to the starting state for the next count of 624. All the other gates in 130 are similarly energized when the associated whole number counts are reached. Gate 130L is shown as the lowest step in the octave where the total count is 1049 to yield an output.

First pulse driver 150 comprises two input nand gates 151 and 152 while second pulse driver 160 comprises a single two input nand gate. Battery voltage +v is applied to respective first inputs of nand gates 151 and 152. The outputs of multiple input nand gates 130 are applied to the second inputs of nand gates 151 and 152. A similar explanation applies to nand gate 160. Output wavepattern 5b2 of nand gate 160 is applied to decade divider chain 120 and the outputs of nand gates 151 and 152 are combined to form a wave-pattern which is applied to saw-tooth generator 200.

Resistor 154 is inserted in series with selector switch 153 in order to provide stability in gates 150 and 160 against UHF oscillations, if any.

In FIG. 3 all dividers are not shown in the interest of simplicity, but that for the note C above the standard note A of 440 Hz is shown. The ideal pitch rate for C is 523.20 beats per second. For the particular oscillator frequency selected, the division by the whole number 624 yields the pitch rate for the note C of 523.08 beats per second. The error is −0.12 beats per second. An error of this magnitude is acceptable for most applications. This error is less than that for many tuning forks.

The outputs of nand gates 130A through 130L for the remaining whole number divisions make up the set of twelve. Each output of nand gates 130A through 130L is connected to a contact on stepping switch 153 used for selecting a desired pitch rate. Switch slider or swinger 153 connects at one time or another with any one of the outputs of nand gates 130A through 130L. Stepping switch 153, which is in series with stabilizing resistor 154, thus serves as a common output to drive the divider reset of decimal divider chain 120 through 2-input nand gate 160 and also to drive saw-tooth generator 200 by way of 2-input nand gates 151 and 152 in parallel. Two nand gates 151 and 152 are required to provide adequate driving power.

Saw-tooth generator 200 comprises transistor 201, capacitor 202 having a value of 0.01 micro farads, resistor 203 having a value of 100,000 ohms, transistor 205, and resistor 206 having a value of 10,000 ohms. Positive voltage +V is applied to resistor 203 and to transistor 204. Transistor 201, capacitor 202, and resistor 206 are grounded.

Saw-tooth generator 200 includes input transistor 201 which clamps capacitor 202 to 0 potential with each pitch rate pulse. Between pulses, the potential rises as charge current through resistor 203 flows from power supply +V. A succeeding pitch rate pulse again reduces capacitor 202 voltage to 0 during a very short pulse, to start the ramp process all over again. In order to reduce interference with this wave while providing a high current capability for sampling, a two stage feedback amplifier including transistors 204 and 205 is used which provides a high impedance input and a low impedance output. The amplifier including transistors 204 and 205 has the property of an emitter follower having both an enhanced beta and power capability. The output wave-form pattern of saw-tooth generator 200 is shown in line 5c1 of FIG. 5.

Figure 4:
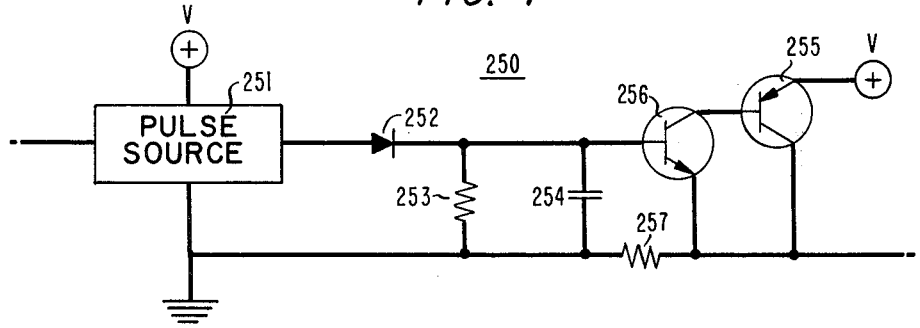
FIG. 4 is a diagram of a second specific illustrative embodiment of a saw-tooth generator according to the present invention.

FIG. 4 is a diagram of a second specific illustrative embodiment of a saw-tooth generator according to the present invention. Saw-tooth generator 250 comprises pulse source 251, silicon diode 252, resistor 253 having a value of 100,000 ohms, capacitor 254 having a value of 0.01 micro farads, transistor 255, transistor 256, and resistor 257 having a value of 10,000 ohms. Pulse source 251 is jointly responsive to output wave-pattern 5b2 of first pulse driver 150 and to positive battery voltage +V. Further, silicon diode 252 is responsive to the wave-form pattern from pulse source 251. Transistor 255 is connected to positive battery voltage +V, while pulse source 251, resistor 253, capacitor 254, and resistor 257 are connected to ground. Accordingly, a second type of ramp voltage output is provided by saw-tooth generator 250 as shown at line 5c2 in FIG. 5. Those skilled in the art shall appreciate that this pulse source function can be effected in several ways.

Modulator 300 comprises capacitor 301 having a value of approximately 1 micro farad, resistor 302 having a value of 10,000 ohms, transistor 303, transistor 304, and transformer 305. Transistor 304 is responsive to the output of saw-tooth generator 200, while resistor 302, transistor 303, and one input of transformer 305 are grounded.

Modulator 300 has the property of a sampling circuit wherein piano string pulses forward bias the 2-stage amplifier comprising transistors 303 and 304 causing current to flow from saw-tooth generator 200 through transistor 304 to transformer 305, which is used to couple to loudspeaker 600. The duration of current flow is controlled by the duration of the sampling pulse, being usually anywhere from 0.1 to 0.25 of a period.

Probe output amplifier 400 comprises resistor 401 having a value of 10,000 ohms, resistor 402 having a value of 5,000,000 ohms, resistor 403 having a value of 47,000 ohms, transistor 404, transistor 405, transistor 406, capacitor 407 having a value of 0.002 micro farads, capacitor 408 having a value of 100 micro farads, and resistor 409 having a value of 47,000 ohms. Resistor 401, transistor 405, and resistor 403 are connected to positive battery voltage +V. Modulator 300 is connected to resistor 401, resistor 402, transistor 406, capacitor 407, and resistor 409. Magnetic sensing probe 500 is connected to transistor 404, capacitor 408, and resistor 409.

Probe output amplifier 400 for magnetic sensing probe 500 is a simple 3-stage transistor amplifier with a self-biased operating point such that the amplifier operates class A for small signals, and class B for large signals. The class B operation of probe output amplifier 400 provides the pulse-like output signal. Resistor 402, having a value of 5,000,000 ohms, is between the output of probe amplifier 400 and transistors 404 and 405 and provides a small amount of positive feedback which enhances the positive-going output signal to further sharpen the pulse-like output of probe output amplifier 400. Also, in order to increase the first stage amplification, the collector current of transistor 404 is increased by bridging the second-stage emitter of transistor 405 with resistor 403. Self bias is established by a DC feedback path from resistor 401 through resistor 409 to capacitor 408 in the first stage base circuit. The base circuit path is completed by a connection from capacitor 408 through magnetic sensing coil 508 of magnetic sensing probe 500 to the base of transistor 404. Probe output amplifier 400 is capable of producing output pulses over a wide range of signal levels from magnetic sensing probe 500 so that long duration pitch sensing sounds are produced as an aid in the piano string tuning or adjusting process.

Magnetic sensing probe 500 comprises sensing coil 508 derived from leads 501 and 502 connected to probe output amplifier 400, iron core 503, flexible iron strip 504, level adjusting screw 505, fastening means 506, and magnet 507. Leads 501 and 502 are wound around iron core 503 to provide sensing coil 508.

Magnetic sensing probe 500 comprises magnet 507, one pole of which is connected to iron extension or fastening means 506 which is shaped to bring its far end close to iron piano string 11 to be adjusted. The arrangement of FIG. 3 makes use of a readily available magnetic block usually made out of ceramic with its north and south poles on opposite faces. The under face of magnet 507 is attracted and held to neighboring piano strings while the upper face provides a magnetic path through a flexible iron fixture which extends beyond magnetic block 507 and then extends downward through iron core 503. Sensing coil 508 is wound around downward extension 503. Magnetic block 507 may be slid along neighboring strings until downward extension or iron core 503 appears over string 11 to be adjusted. Thereafter, downward extension 503 is brought close to string 11 without touching such string. This can be effected utilizing level adjusting screw 505 which allows such flexible fixture to be moved up or down and remain in a desired position. The outputs of magnetic sensing probe 500 derived via leads 501 and 502 are respectively connected to transistor 404, and capacitor 408 and resistor 409.

According to the present invention a twelve-tone set of pitch reference standards situated in the middle of range of piano pitches, for example, around the standard note A, is usable over the whole range of piano pitches with the arrangement described herein. Further, the chirp characteristics are everywhere discernable and render easy determination of the state of the pitch and facilitates ready correction where needed.

While the arrangement according to the present invention has been described in terms of specific illustrative embodiments, it will be apparent to those skilled in the art that many modifications are possible within the spirit and scope of the disclosed principal.

What is claimed is:

1. A pitch sensor for determining the frequency of a first signal from a first signal source comprising:
reference pitch pulse generating means for providing a plurality of equal-time interval reference pitch pulses;
saw-tooth generating means being responsive to said reference pitch pulse generating means for providing a plurality of equal-time interval ramp wave-forms;
probe sensing means being responsive to said first signal source for providing a first electrical signal representative of said first signal; and
modulator means being jointly responsive to said saw-tooth generating means and to said probe sensing means for sampling said saw-tooth ramp wave-form with said first electrical signal, the output of said modulator means indicating whether the frequency of said first signal is above or below said reference pitch pulses.

2. The pitch sensor of claim 1 wherein said reference pitch pulses are unidirectional.

3. The pitch sensor of claim 1 wherein amplifying means are interposed between said probe sensing means and said modulator means.

4. The pitch sensor of claim 3 wherein said amplifying means is responsive to said probe sensing means to provide equal-time interval unidirectional signals to said modulator means.

5. The pitch sensor of claim 1 wherein said saw-tooth ramp wave-forms are unidirectional.

6. The pitch sensor of claim 1 wherein said saw-tooth ramp wave-form varies from a first value to a second value greater than said first value during each such equal-time interval, the output of said modulator means indicating whether the frequency of said first signal is above, at, or below said reference pitch pulses.

7. The pitch sensor of claim 1 wherein said saw-tooth ramp wave-form varies from a first value to a second value less than said first value during each such equal-time interval, the output of said modulator means indicating whether the frequency of said first signal is above, at, or below said reference pitch pulses.

8. The pitch sensor of claim 1 wherein said saw-tooth ramp wave-form varies from a first value to a second value greater than said first value during the first half of each such equal-time interval and from said second value to said first value during the second half of each such equal-time interval, the output of said modulator means indicating whether the frequency of said first signal is above or below said reference pitch pulses.

9. The pitch sensor of claim 1 also comprising output means being responsive to said modulator means for providing an audio output signal representative of said modulator means output.

10. The pitch sensor of claim 1 wherein said first signal source is a vibrating iron member and wherein said probe sensing means is a magnetic probe sensing means for determining the motion of said iron member.

11. The pitch sensor of claim 1 wherein said reference pitch pulse generating means further comprises:
oscillating means for providing equal-time interval square wave-forms;
first pulse driving means;
divider means being normally responsive to said oscillating means and being re-settable by second pulse driving means for providing a plurality of divider means output signals;
gating means having a similar plurality of input terminals and being responsive to said plurality of divider means output signals for providing a similar plurality of gating means output signals; and
selective switching means being selectively responsive to any one of said plurality of gating means output signals;
said first pulse driving means being selectively responsive to said gating means by said selective switching means for providing said reference pitch pulses; and
said second pulse driving means also being selectively responsive to said gating means by said selective switching means for resetting said divider means.

12. The pitch sensor of claim 11 wherein said oscillating means is a crystal oscillating means.

13. The pitch sensor of claim 11 wherein said divider means is a decimal divider means.

14. The pitch sensor of claim 11 wherein said divider means has twelve output terminals being representative of one octave.

15. The pitch sensor of claim 11 wherein said gating means includes twelve input terminals and twelve output terminals being representative of one octave.

16. The pitch sensor of claim 11 wherein said selective switching means is selective to either of twelve terminals of said gating means.

17. The pitch sensor of claim 7 wherein said saw-tooth generating means further comprises:
pulse source means having first and second input terminals and first and second output terminals, said pulse source means being responsive to said reference pitch pulse generating means and to a direct current voltage means at said first and second input terminals, respectively, for providing a plurality of equal time interval pulses at said first output terminal, said second output terminal being connected to ground;
forward biased silicon diode means including first and second terminals, said forward biased silicon diode means first terminal being connected to said pulse source means first output terminal;
first resistor means having first and second terminals;
capacitor means having first and second terminals;
second resistor means having first and second terminals;
first transistor means having first, second, and third terminals; and
said forward biased silicon diode means second terminal, said first resistor means first terminal, said capacitor means first terminal, and said first transistor means first terminal being connected to each other,
said first resistor means second terminal, said capacitor means second terminal, and said second resistor means first terminal being connected to ground,
said first transistor means second terminal and said second transistor means first terminal being connected to each other,
said second transistor means second terminal and said direct current voltage means being connected to each other, and
said second resistor means second terminal, said first transistor means third terminal, and said second transistor means third terminal being connected to each other for providing the wave form output of said saw tooth generating means.

* * * * *